(12) United States Patent
Kim et al.

(10) Patent No.: US 6,591,381 B1
(45) Date of Patent: Jul. 8, 2003

(54) 2-DIMENSIONAL INTERLEAVING APPARATUS AND METHOD

(75) Inventors: Beong-Jo Kim, Kyonggi-do (KR); Min-Goo Kim, Kyonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/543,792

(22) Filed: Apr. 6, 2000

(30) Foreign Application Priority Data

Apr. 6, 1999 (KR) .......................... 1999-11799

(51) Int. Cl.[7] .................... G06F 11/00; H03M 13/03
(52) U.S. Cl. ........................... 714/701; 714/786
(58) Field of Search ........................ 714/755, 776, 714/781, 804, 701

(56) References Cited

U.S. PATENT DOCUMENTS

| | | | |
|---|---|---|---|
| 5,446,747 A | | 8/1995 | Berrou |
| 5,898,710 A | * | 4/1999 | Amrany ................. 711/157 |
| 6,023,783 A | * | 2/2000 | Divsalar et al. .......... 375/262 |
| 6,304,991 B1 | * | 10/2001 | Rowitch et al. ............ 714/755 |

OTHER PUBLICATIONS

Turbo code performance as a function of code block size Dolinar et al. Information Theory, 1998. Proceedings. 1998 IEEE International Symposium on , 1998 p. 32.*

* cited by examiner

Primary Examiner—Albert Decady
Assistant Examiner—Cynthia Britt
(74) Attorney, Agent, or Firm—Dilworth & Barrese, LLP (57) ABSTRACT

An encoding device including a first feedback convolutional encoder for encoding n data streams using a primitive polynomial of m'th order, a 2-dimensional interleaver for segmenting the n data streams into k data groups and reading the n data streams from the k data groups and interleaving the n data streams, and a second feedback convolutional encoder for encoding the interleaved data streams from the 2-dimensional interleaver using the primitive polynomial of m'th order. The encoding device comprises a controller for controlling selection of the data groups such that an output of the 2-dimensional interleaver differs from a specific pattern, when k is a positive multiple of $2^m-1$ and at least one of the data groups has said specific pattern.

18 Claims, 11 Drawing Sheets

2-DIMENSIONAL INTERLEAVING APPARATUS AND METHOD

BACKGROUND OF THE INVENTION

1. Field of the Invention

The present invention relates generally to an interleaving/deinterleaving device and method, and in particular, to a 2-dimensional interleaving/deinterleaving device and method for a turbo encoder used in radio communication systems such as satellite, ISDN (Integrated Services Digital Network), digital cellular, W-CDMA (Wideband Code Division Multiple Access), IMT-2000 and W-ATM (Wideband Asynchronous Transfer Mode) communication systems.

2. Description of the Related Art

A turbo code is a type of error correction code which affects the reliability of a digital communication system. Conventionally, turbo codes are divided into serial turbo codes and parallel turbo codes. A parallel turbo encoder encodes an input frame of L information bit streams into parity symbols using two simple parallel concatenated codes, wherein recursive systematic convolutional (RSC) encoders are typically used as the component encoders. In addition, the parallel turbo encoder includes an interleaver connected between the component encoders.

In the turbo encoder, interleaving is performed to randomize data streams on a frame unit basis and to improve the distance property of a codeword. In particular, it is expected that the turbo encoder will be used in a supplemental channel (or traffic channel) of an IMT-2000 (or CDMA-2000) communication system and in a data channel of UMTS (Universal Mobile Telecommunication System), as proposed by ETSI (European Telecommunication Standards Institute). Therefore, a reliable method for employing a turbo interleaver with a turbo encoder for this purpose is required.

Figure 1:
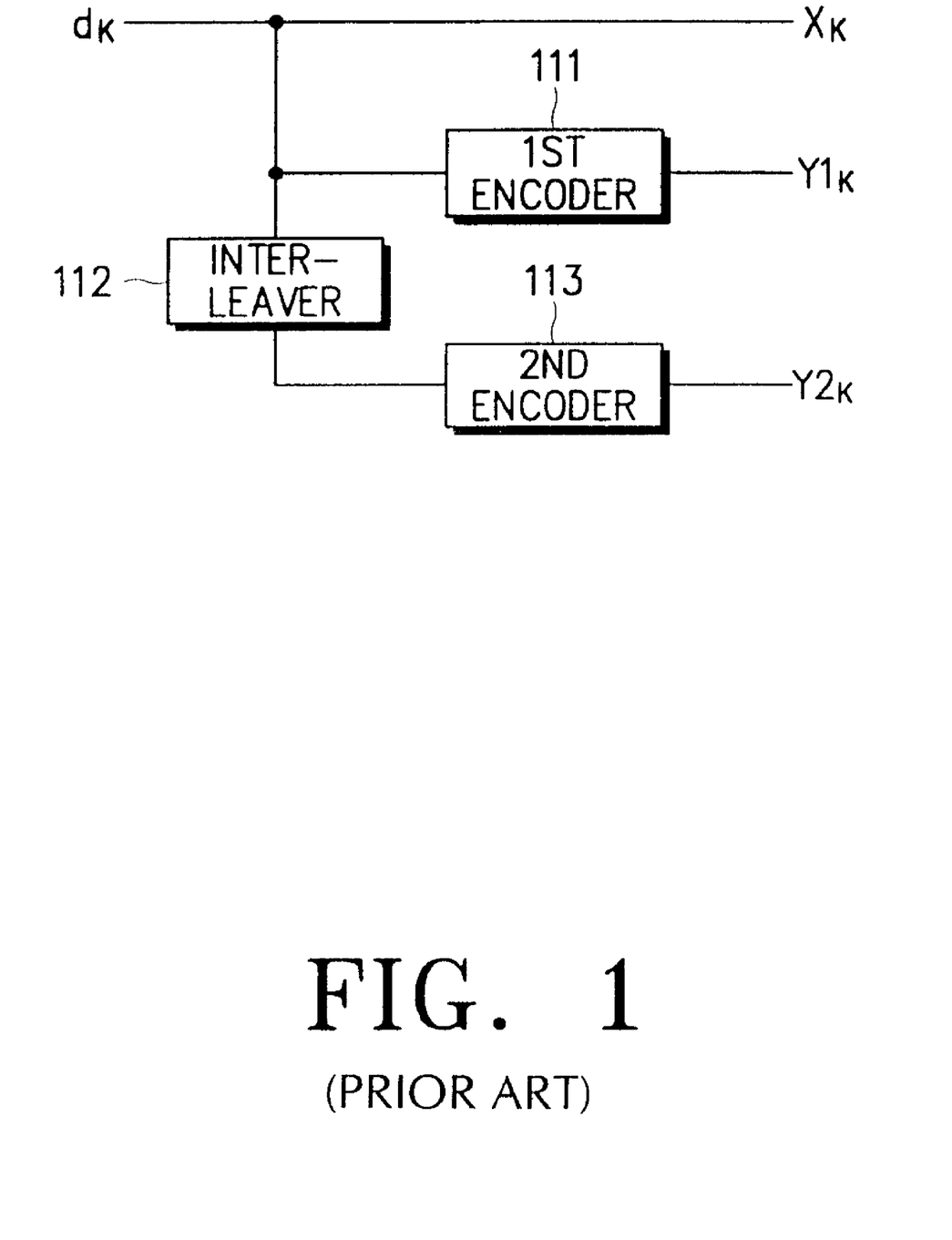
FIG. 1 is a block diagram illustrating a conventional turbo encoder.

FIG. 1 shows a common parallel turbo encoder, which is disclosed in detail in U.S. Pat. No. 5,446,747, issued on Aug. 29, 1995, which is hereby incorporated by reference.

Referring to FIG. 1, the turbo encoder includes a first component encoder 111 for encoding input frame data, an interleaver 112 for interleaving the input frame data, and a second component encoder 113 for encoding an output of the interleaver 112. A known RSC (Recursive Systematic Convolutional) encoder or NSC (Non-Recursive Systematic Convolutional) encoder is typically used for the first and second component encoders 111 and 113. Such component encoders have different structure according to a coding rate, a constraint length K and a generator polynomial. Further, the interleaver 112 has the same size as the input information bit frame, and rearranges the sequence of the information bits provided to the second component encoder 113 to reduce a correlation between the information bits.

For the internal interleaver (or a turbo interleaver) 112 of the turbo encoder, various interleavers are proposed, such as PN (Pseudo Noise) random interleavers, random interleavers, block interleavers, non-linear interleavers, and S-random interleavers. However, so far, such interleavers are mere algorithms designed to improve their performances in terms of scientific researches rather than implementation. When implementing an actual system, the hardware implementation complexity must be taken into consideration. A description will now be made of properties and problems associated with the conventional interleaver for the turbo encoder.

Performance of the turbo encoder is dependent upon the internal interleaver. In general, an increase in the input frame size (i.e., the number of information bits included in one frame) gives rise to an increase in the performance of the turbo encoder. However, an increase in interleaver size requires an increase in calculations. Therefore, in general, if the frame size is very large, it is not practical to implement the interleaver.

According to experiments, random interleaver is superior in performance to a block interleaver. However, the random interleaver is disadvantageous in that an increase in the variety and size of the frame causes an increase in the required memory capacity for storing an interleaver index (i.e., mapping rule or address). That is, the memory capacity required for addressing greatly increases. Therefore, taking the required hardware size into consideration, it is preferable to employ an address enumeration method for reading data stored at a corresponding address by generating an address at every symbol clock using an index generating rule rather than a look-up table method for storing the interleaver index.

In conclusion, when various interleaver sizes are required and the hardware complexity is restricted in an IMT-2000 or UMTS system, the turbo interleaver should be designed to guarantee optimal interleaver performance by taking inherent restrictions into consideration. That is, an interleaver which performs interleaving/deinterleaving according to a specific interleaving rule is required. In addition, the turbo interleaver requires good interleaver properties (e.g., distance property, weight property and random property).

The IMT-2000 or UMTS specification is yet to provide any definition for the turbo interleaver. The forward link and the reverse link defined by the IMT-2000 specification have various types of logical channels and various interleaver sizes. Therefore, in order to meet these various requirements, an increased memory capacity is required. For example, in a CDMA-2000 forward link transmission mode, an interleaver of various sizes ranging from 144 bits/frame to 36864 bits/frame may be used. In addition, the interleaver can be classified into a 1-dimensional interleaver for performing interleaving by regarding the whole input frame as one area and a 2-dimensional interleaver for dividing the input frame into several partial areas to perform interleaving according to the divided areas.

To sum up, the prior art has the following disadvantages.

First, for the conventional internal interleaver of the turbo encoder, PN random interleavers, random interleavers, block interleavers, non-linear interleavers, and S-random interleavers may be used. However, such interleavers are mere algorithms designed to improve their performances in terms of scientific researches rather than implementation. Therefore, when implementing an actual system, the hardware implementation complexity of such interleavers must be considered. However, this is not specifically defined.

Second, since a controller (CPU or host) of the transceiver must store interleaving rules according to the respective interleaver sizes in the existing interleaving method using a look-up table, a host memory requires a separate capacity in addition to an interleaver buffer. That is, when the frame size is varied and increased, an increase in memory capacity for storing the interleaver index (i.e., mapping rule or address) is required. That is, it has a disadvantage of requiring a large increase in memory capacity.

Third, it is not easy to implement an interleaver satisfying both the distance property and the random property.

Fourth, when a 2-dimensional interleaver is used, the areas are selected without consideration of the periodicity of the component encoder, so that a state of the component encoder may be reset.

SUMMARY OF THE INVENTION

It is, therefore, an object of the present invention to provide an interleaving/deinterleaving device and method for maximizing a distance property of a turbo encoder in a communication system.

It is another object of the present invention to provide an interleaving device and method for a turbo encoder, which divides input frame data by specific size before interleaving.

It is yet another object of the present invention to provide a 2-dimensional interleaving device and method for controlling group selection such that a period for selecting a specific group should be different from a period of a component encoder in the turbo encoder.

To achieve the above object, an encoding device is provided, including a first feedback convolutional encoder for encoding n data streams using a primitive polynomial of m'th order, a 2-dimensional interleaver for segmenting the n data streams into k and interleaving the n data streams data groups and reading the n data streams from the k data groups and interleaving the n data streams, and a second feedback convolutional encoder for encoding the interleaved data from the 2-dimensional interleaver using the primitive polynomial of m'th order. The encoding device comprises a controller for controlling selection of the data groups such that an output of the 2-dimensional interleaver does not coincide with a specific pattern, when k is a positive multiple of $2^m-1$ and at least one of the data groups has said specific pattern.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

A preferred embodiment of the present invention will be described herein below with reference to the accompanying drawings. In the following description, well-known functions or constructions are not described in detail to avoid obscuring the invention in unnecessary detail.

To design a turbo encoder which has optimal performance with respect to various frame sizes, many parameters must be considered, such as the amount of memory for the.component encoders of the turbo encoder (i.e., constraint length K), generator polynomials and an optimal coding rate. It is very difficult to design a turbo encoder which has optimal performance through experiments, in a state where it is not verified how such parameters affect the performance.

Therefore, in general, the interleavers are implemented by determining conditions satisfying several given criteria. The criteria are as follows:

Distance Property: The distance between adjacent codeword symbols should be maintained to a certain extent. Since this has the same function as a codeword distance property of a convolutional code, it is preferable that the interleaver be designed to have a longer distance, if possible.

Weight Property: The weight of a codeword corresponding to a non-zero information word should be higher than a threshold value. Since this has the same function as the minimum distance property of the convolutional code, it is preferable that the interleaver should be designed to have a greater weight, if possible.

Random Property: The correlation factor between output word symbols after interleaving should be much lower than the correlation factor between original input word symbols before interleaving. That is, randomization between the output word symbols should be completely performed. This makes a direct effect on the quality of extrinsic information generated in continuous decoding.

A description of the invention will now be described hereinbelow with reference to the accompanying drawings.

The invention proposes an optimal interleaving/deinterleaving device satisfying properties (including distance property, weight property and random property) of the turbo interleaver.

Generally, as an internal interleaver of the turbo encoder, a random interleaver has good performance, especially with larger frame sizes. Therefore, the invention proposes using a 2-dimensional interleaver, which has a low complexity while satisfying the properties of a random interleaver. The 2-dimensional interleaver divides the input frame size into a plurality of groups and applies a specific interleaving rule according to the groups. A group selection period, defined as the period between when a specific group is selected and when the same specific group is subsequently selected, does not coincide with a period of an internal component encoder. Further, an embodiment of the present invention applies a linear feedback shift register (LFSR) for generating a PN sequence to each group and uses a random number generated therefrom as a read address. However, the present invention is not limited to a method of performing interleaving on a group unit basis, and aims at selecting the addresses generated according to groups in consideration of a periodicity of the component encoder. Further, not only the conventional component encoder but also a component encoder defined by the CDMA-2000 specification and the UMTS specification can be used for the first and second component encoders of the turbo encoder according to the present invention. In addition, the interleaver according to the present invention can be applied to a channel interleaver as well as an internal interleaver of a serial turbo encoder.

Figure 2:
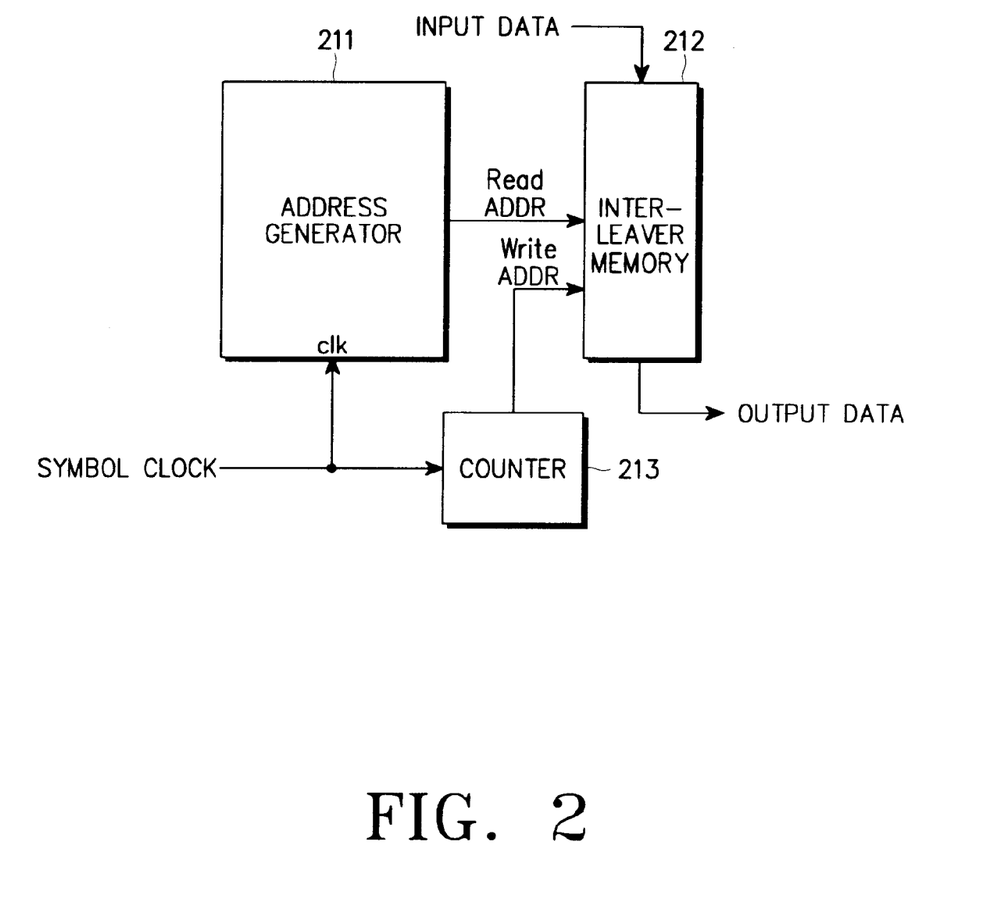
FIG. 2 is a block diagram illustrating an interleaving device in a communication system according to an embodiment of the present invention.
Figure 3:
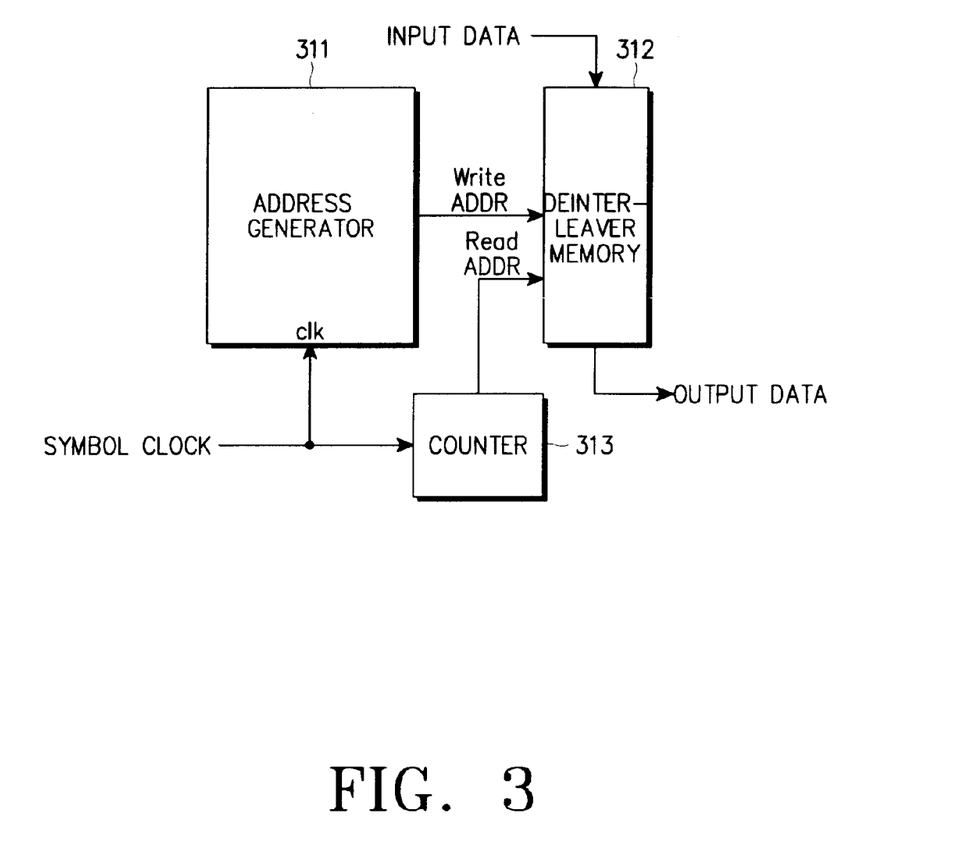
FIG. 3 is a block diagram illustrating a deinterleaving device in a communication system according to an embodiment of the present invention.

FIGS. 2 and 3 show the structure of an interleaver and deinterleaver, respectively, according to the present invention.

With reference to FIG. 2, a description will be made of the interleaver for interleaving the frame data output. An address generator 211 generates a read address for rearranging the sequence of data bits according to an input frame data size L and an input clock, and provides the generated read address to an interleaver memory 212. The interleaver memory 212 sequentially stores the input data in a write mode of operation, and reads the data according to the address provided from the address generator 211 in a read mode of operation. A counter 213 receiving an input clock, provides a write address to the interleaver memory 212. As stated above, the interleaver sequentially stores input data in the interleaver memory 212 in the write mode of operation, and reads the data stored in the interleaver memory 212 according to the read address generated by the address generator 211 in the read mode of operation. Alternatively, the interleaver can store the input data in the interleaver memory 212 after rearranging the sequence of the data bits in the write mode of operation, and sequentially read the data in the read mode of operation.

With reference to FIG. 3, a description will be made of the deinterleaver according to an embodiment of the present invention. An address generator 311 generates a write address for restoring the sequence of the input data to the original state according to the input frame data size L and the input clock, and provides the generated write address to a deinterleaver memory 312. The deinterleaver memory 312 stores the input data according to the write address provided from the address generator 311 in the write mode of operation, and sequentially reads the stored data in the read mode of operation. A counter 313 receiving the symbol clock, provides the deinterleaver memory 312 with a read address for reading the data from the deinterleaver memory 312. As stated above, the deinterleaver has the reverse operation of the interleaver but has the same structure as the interleaver. The only difference therebetween is the sequence of the input data bits in the write and read modes. Therefore, a description will be made hereinbelow with reference to only the interleaver.

In general, for a given input frame size, performance of the turbo encoder is determined depending on a constraint length K and the properties of the turbo interleaver. In designing a decoder, the constraint length K is set to 3 or 4 in consideration of the resulting complexity and the desired performance improvement. For example, in CDMA-2000 and UMTS systems, the constraint length K is normally set to 4 (K=4). On the contrary, for the turbo interleaver (i.e., interleaver for the turbo encoder), it is very difficult to select properties which result in an optimal turbo interleaver, since there are too many design parameters. Therefore, research is carried out using a less than optimal turbo interleaver, rather than an optimal turbo interleaver.

First, it is necessary to analyze properties of the convolutional code. For a general convolutional code, when a Hamming weight W(I) of an input sequence I is low, a weight of the code is also low. Otherwise, when the Hamming weight W(I) is high, the weight of the code is also high. This is based on the property of a feed forward convolutional code. Unlike a convolutional code, a turbo code using a recursive convolutional code has an infinite impulse response sequence. That is, for K=4, when an input sequence of 100000 . . . 0 is used, a component code sequence having a period of 7 is generated.

FIG. 1 shows a structure of the turbo encoder. As illustrated, the turbo interleaver included in the turbo encoder is connected between two component encoders for which the recursive convolutional encoders are used. The turbo interleaver interleaves the input data so as to enable the second encoder to generate a code having a high weight when the first encoder generates a code having a low weight. Accordingly, although the code output from the first encoder has a low weight, the code output from the second encoder has a high weight, thereby making it possible to increase the overall weight of the codes. For example, when an input sequence of 100000 . . . 0 is input to a K=4 turbo encoder, each component encoder in the turbo encoder generates a periodic binary sequence having a period of $2^{(K-1)}-1=7$. A pattern of this sequence is related to a generator polynomial of the turbo encoder. In addition, a finite code sequence can be generated by resetting a state of the component encoder to a zero state with respect to a specific input sequence other than a zero sequence encoder.

For example, when K=4, for an input sequence of 10000001000000000. . . , a state of the first component encoder is reset to the zero state after encoding the second '1' bit. Further, for every case where the distance between the two 1's is a multiple of 7, due to the periodicity, the state of the first encoder is reset in the same manner. Therefore, all the succeeding codes become zero, causing a decrease in the minimum distance of the turbo code. In this case, the turbo interleaver breaks such a pattern of the input sequence so that the second component encoder has a higher code weight, thereby increasing the minimum weight of the turbo encoder.

Such a turbo interleaver can be divided into a 1-dimensional turbo interleaver and a 2-dimensional turbo interleaver according to a designing method. The 1-dimensional interleaver performs interleaving, regarding the whole frame to be interleaved as one object. The 2-dimensional interleaver divides the whole frame into sub-frames or a plurality of groups having the same size, and then, each group independently performs interleaving using the corresponding interleaving rule. In general, the 2-dimensional turbo interleaver is superior in performance to the 1-dimensional turbo interleaver, and has interleaving rules according to the groups, thereby providing a simple optimization process when compared with the 1-dimensional turbo interleaver.

Figure 4:
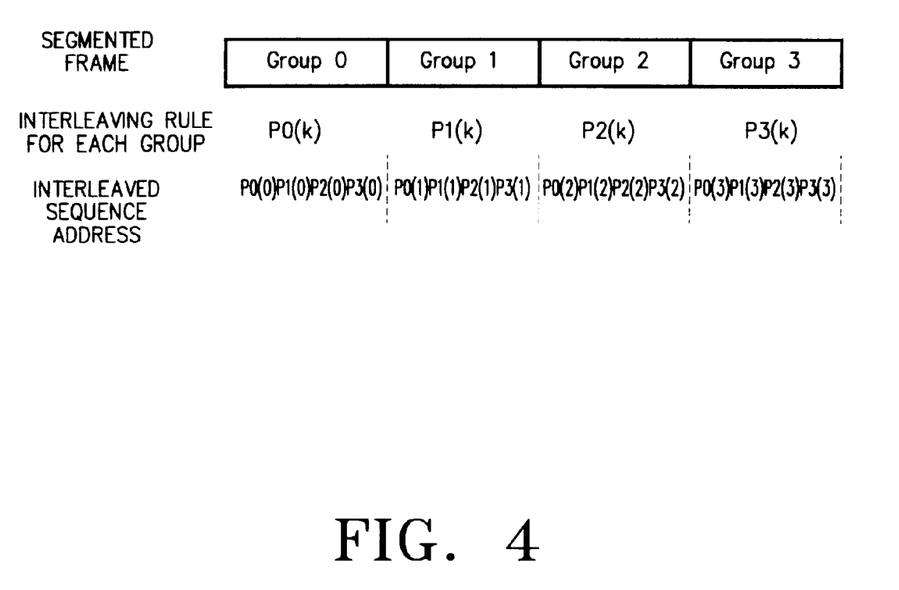
FIG. 4 is a diagram for illustrating an operational principle of a 2-dimensional turbo interleaver.

FIG. 4 is a diagram illustrating an operational principle of the 2-dimensional turbo interleaver. Referring to FIG. 4, an input frame is segmented into 4 groups of Group 0, Group 1, Group 2 and Group 3. P0(k) indicates an interleaving rule for the interleaving data of Group 0; P1(k) indicates an interleaving rule for the interleaving data of Group 1; P2(k) indicates an interleaving rule for the interleaving data of Group 2; and P3(k) indicates an interleaving rule for the interleaving data of Group 3. Further, P0(0), P1(0), P2(0) and P3(0) indicate addresses for the data interleaved in the respective groups, when k=0. P0(1), P1(1), P2(1) and P3(1) indicate addresses for the data interleaved in the respective groups, when k=1. P0(2), P1(2), P2(2) and P3(2) indicate addresses for the data interleaved in the respective groups, when k=2. P0(3), P1(3), P2(3) and P3(3) indicate addresses for the data interleaved in the respective groups, when k=3. That is, at every k, one data bit is read from each group according to the interleaving rule Pg(k) corresponding to the group. This can be regarded as a natural expansion for 1-dimensional interleaving, where the group number is 1. Of course, the groups can be selected sequentially or according to a specific rule. For example, the groups can be selected in the order of 0, 2, 1 and 3 by changing the overall interleaving rule, rather than in the order of 0, 1, 2 and 3 as shown in FIG. 4. That is, FIG. 4 shows a case where the data bit number of the input frame is 16, the input frame is segmented into 4 groups, each having 4 bits, and each group is interleaved according to its associated interleaving rule.

Such 2-dimensional turbo interleaving may have a problem. That is, when the group number is equal to a period of the component encoder or a multiple of the period, the minimum distance of the turbo code is highly decreased. For example, for k=4, the period is 7. Therefore, if the group number is 7, or a multiple of 7, there is a probability of resetting each component encoder to the zero state.

Figure 5:
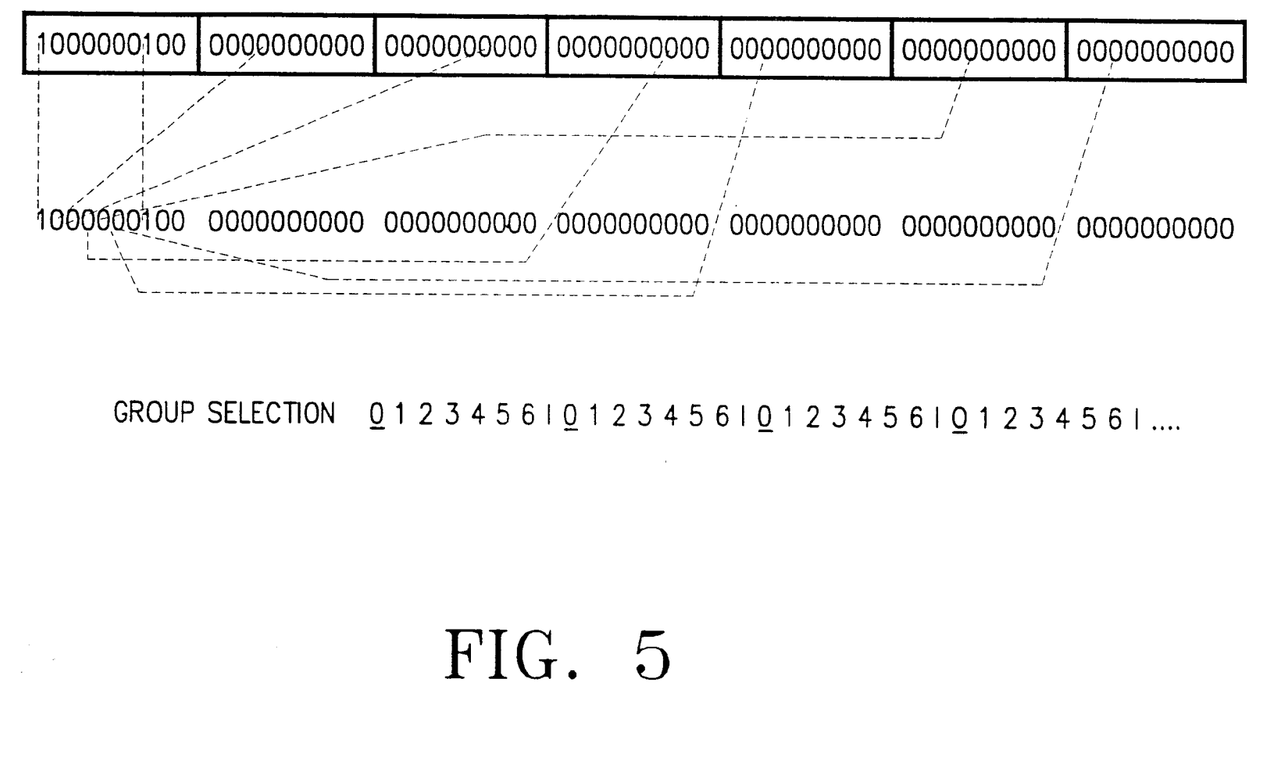
FIG. 5 is a diagram illustrating an output for a specific input sequence, when K=4, $N_g$=7 and group selection is performed sequentially.

FIG. 5 shows the worst case where an input sequence 100000010000. . . of the turbo encoder is maintained even after interleaving. As illustrated, a pattern of the input sequence is maintained even after interleaving. Therefore, the second component encoder is also reset in the zero state, thereby decreasing a minimum weight of the turbo code. This corresponds to every case where the group number is a multiple of 7. In most cases, the minimum distance is generated when the group number is 7 or 14. Consequently, the turbo interleaver has a very short minimum distance, causing a decrease in the overall BER (Bit Error Rate) or FER (Frame Error Rate) performance of the turbo codes.

Therefore, to solve the above problem when designing the 2-dimensional turbo interleaver, the invention changes a group selection pattern such that a group selection period, the period between subsequent selections of the same group, is different from a period of the component encoder in the turbo encoder. That is, the present invention aims at maximizing the minimum distance of the turbo code by analyzing the property of the turbo encoder when the 2-dimensional turbo interleaver performs group selection.

Now, a description will be made of a turbo interleaving device which maximizes the minimum distance of the turbo code according to an embodiment of the present invention.

The most effective method of randomizing a group selection periodicity is to change the group to be selected first at every period. Table 1 below shows an example of such a method when k=4 and the group number is 7. Although Table 1 shows that group selection is made sequentially on a cyclical shift basis, it is also possible that group selection is made randomly on a cyclical shift basis according to a predetermined pattern.

For example, in Table 1, when the shift step is 2, the groups are selected using the order 0123456 at a first period, and the groups are selected using the order 2345601, where the group selection order is shifted by 2, at a second period. That is, at every group selection period, the groups are selected in the group selection order determined by shifting the previous group selection order by 2, as illustrated in Table 1 moving from left to right in the "2" row. When the groups are selected by cyclic shifting as shown in Table 1, a specific group selection order repeats after 7 different group selection orders, thereby increasing the minimum distance. That is, when the shift step is 0, the group selection pattern has the same pattern as the previous one at every period. However, when the shift step is 1, 2, 3, 4, 5 and 6, a specific group selection pattern occurs after 7 different group selection patterns have cycled. That is, the group selection order is changed by cyclically shifting so that the period if the turbo encoder should be different than the cyclical shifting order.

Such cyclic shifting group selection can be simply implemented. Each group selection is determined by Equation (1) below.

$$g=(clk\%N_g+\text{shift\_step}*k)\%NG \text{ for } clk=0, \ldots, \text{frame\_length} \quad [\text{Equation 1}]$$

For example, in case that Ng=7 and the shift_step=1, k=0,0,0,0,0,0,0,1,1,1,1,1,1,1. . . if clk is 0,1,2,3,4,5,6, 7,8,9,10,11,12,13. . . , and accordingly, it is outputted with g=0,1,2,3,4,5,6,1,2,3,4,5,6,0. . . where $N_g$ denotes a group number, clk denotes a data clock in a bit unit, which is a type of counter, and k denotes a counter which is initialized to 0 (k=0), and increases by one at every Ng group selection the order of a group to be selected first. Further, shift_step is a given number satisfying GCD($2^K$-1,shift_step)=1 and is a constant which is dependent on the constraint length K. That is, it is possible to implement cyclic shifting using two counters and one address adder.

Although the invention has been described with reference to the cyclic group shifting method wherein the group selection order increases sequentially, it is also possible to randomly output the interleaving addresses from each group in order to increase the distance property of the turbo interleaver.

For example, assume that k=4 and the group number $N_g$=7. In this case, it is not possible to randomize the group selection periodicity without cyclic group shifting, no matter which group multiplexing method is used. Therefore, after increasing the group selection period by cyclic shifting, the group multiplexing randomizes group selection according to a pattern. Here, "group multiplexing" refers to randomly selecting the groups according to a specific pattern. Although the group selection order is shifted by cyclic shifting, the specific pattern for randomly selecting the groups is not changed. That is, group selection is performed while the specific pattern is shifted.

TABLE 1

| Shift Step | Group Selection Order | | | | | | | |
|---|---|---|---|---|---|---|---|---|
| 0 | 0123456 | 0123456 | 0123456 | 0123456 | 0123456 | 0123456 | 0123456 | 0123456 |
| 1 | 0123456 | 1234560 | 2345601 | 3456012 | 4560123 | 5601234 | 6012345 | 0123456 |
| 2 | 0123456 | 2345601 | 4560123 | 6012345 | 1234560 | 3456012 | 5601234 | 0123456 |
| 3 | 0123456 | 3456012 | 6012345 | 2345601 | 5601234 | 1234560 | 4560123 | 0123456 |
| 4 | 0123456 | 4560123 | 1234560 | 5601234 | 2345601 | 6012345 | 3456012 | 0123456 |
| 5 | 0123456 | 5601234 | 3456012 | 1234560 | 6012345 | 4560123 | 2345601 | 0123456 |
| 6 | 0123456 | 6012345 | 5601234 | 4560123 | 3456012 | 2345601 | 1234560 | 0123456 |

Figure 6:
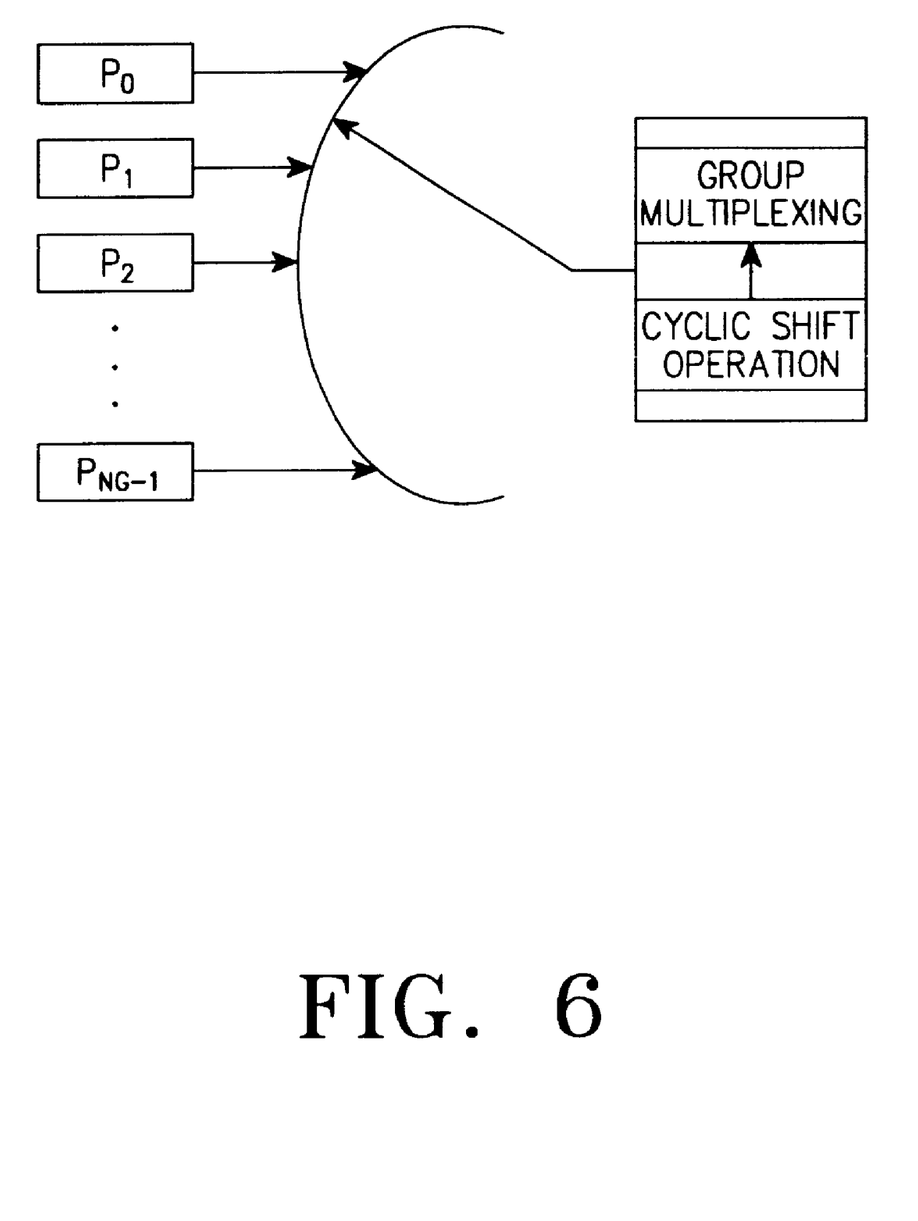
FIG. 6 is a diagram illustrating a group selection concept of a 2-dimensional interleaving device according to an embodiment of the present invention.

FIG. 6 illustrates a group selector in the 2-dimensional interleaving device, which has a group multiplexing operation for random group selection and a cyclic shift operation for shifting the group selection order at every period to randomize the group selection periodicity.

Referring to FIG. 6, the group selector determines whether the group number $N_g$ is a multiple of $2^{(K-1)}-1$, and, if so, increases the group selection period by the cyclic group shifting operation. Thereafter, based on the increased group selection period, the group multiplexer randomly selects the groups according to the specific pattern.

Figure 7:
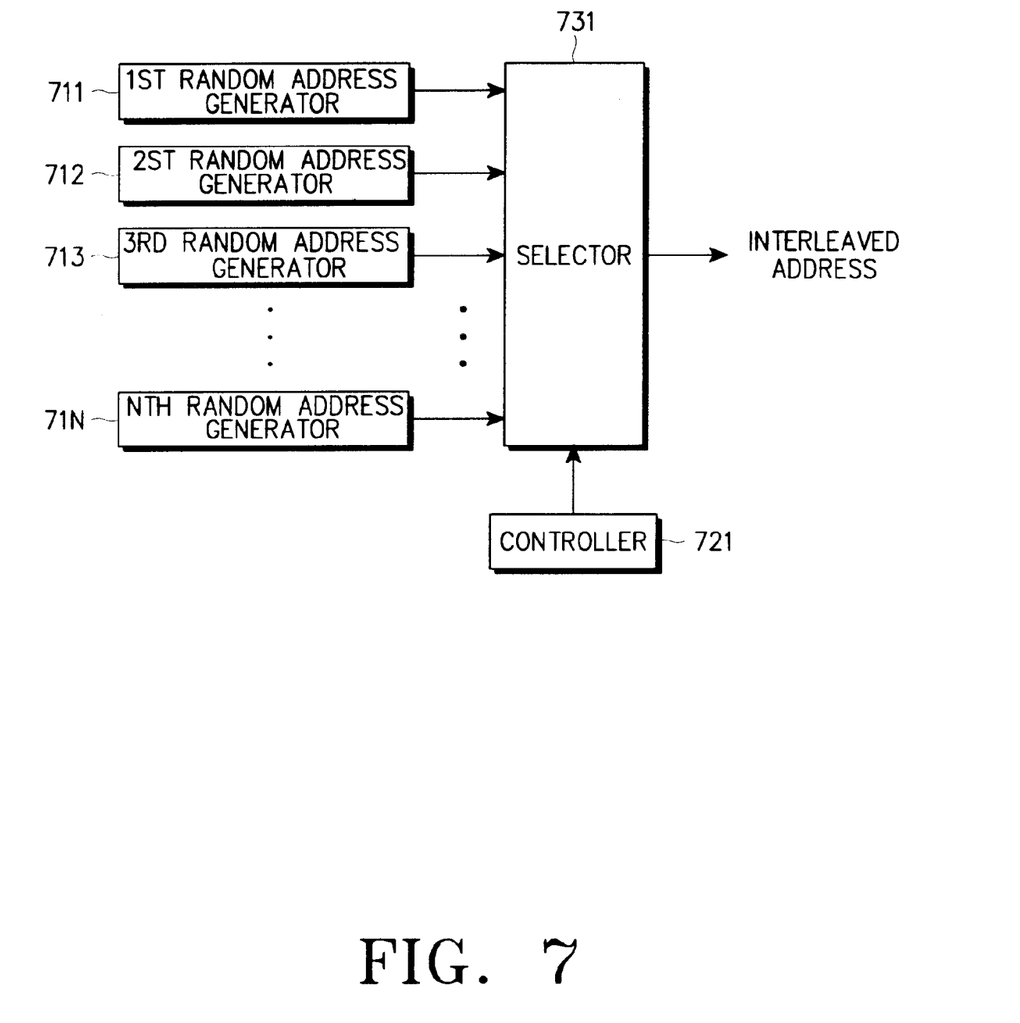
FIG. 7 is a diagram illustrating a 2-dimensional interleaving device according to an embodiment of the present invention.

FIG. 7 illustrates an address generator for performing 2-dimensional interleaving according to an embodiment of the present invention.

Referring to FIG. 7, random address generators 711–71N generate read addresses according to a given interleaving rule using an address generator for their associated groups. A controller 721 controls multiplexing of the selector 731. The selector 731 selects the addresses generated by the address generators 711–71N under the control of the controller 721. The output addresses are used for reading the input frame data stored sequentially in the interleaver memory 212. As described above, the 2-dimensional interleaving method segments the interleaver size into a plurality of groups, performs interleaving according to the segmented groups to generate the addresses, and then sequentially or randomly selects the generated addresses to use them as read addresses. In this case, the group selection order of the selector plays an important role in obtaining a good interleaving property. The present invention proposes a fundamental method for shifting the group selection order at every period by cyclic shifting, and a supplemental method for randomizing the group selection order to increase the distance property of the interleaver.

With regard to an operation of the address generator of FIG. 7, the address generators 711–71N generate the addresses using their associated interleaving rules in the corresponding groups. For example, one can use a linear feedback shift register (LFSR) for the address generator. The controller 721 provides the selector 731 with a select signal for selecting the addresses generated by the address generators 711–71N. The controller 721 outputs a group select signal for cyclic shifting as shown in Table 1. For example, when the shift step is 2, the controller 721 outputs a select signal for shifting the group selection order by 2 at every period in the order of 0123456 at the first period, 2345601 at the second period, . . . , and 5601234 at the seventh period. To increase the distance property of the interleaver, the controller 721 can randomly select the groups according to a specific pattern. The specific pattern is shifted at every Ng group selections but the sequence thereof is not changed. The selector 731 selects the addresses generated by the address generators according to the select signal from the controller 721. The selected addresses are used for randomly reading the input frame data stored sequentially in the interleaver memory 212.

Figure 8A:
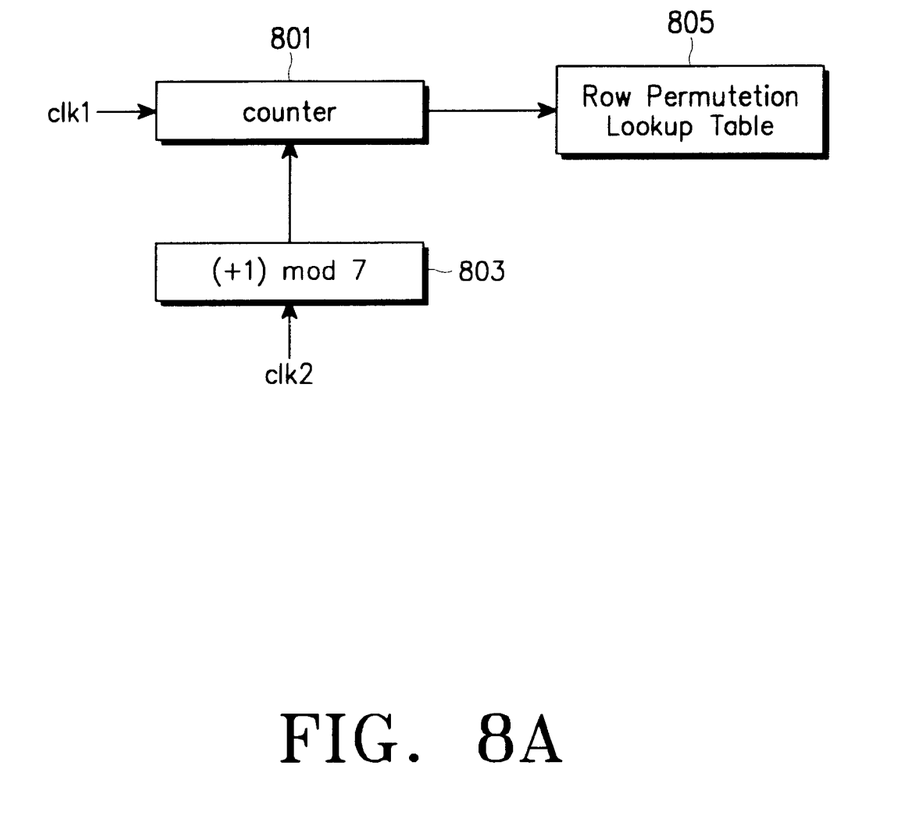
FIG. 8A is a detailed block diagram illustrating the controller of FIG. 7 according to an embodiment of the present invention.
Figure 8B:
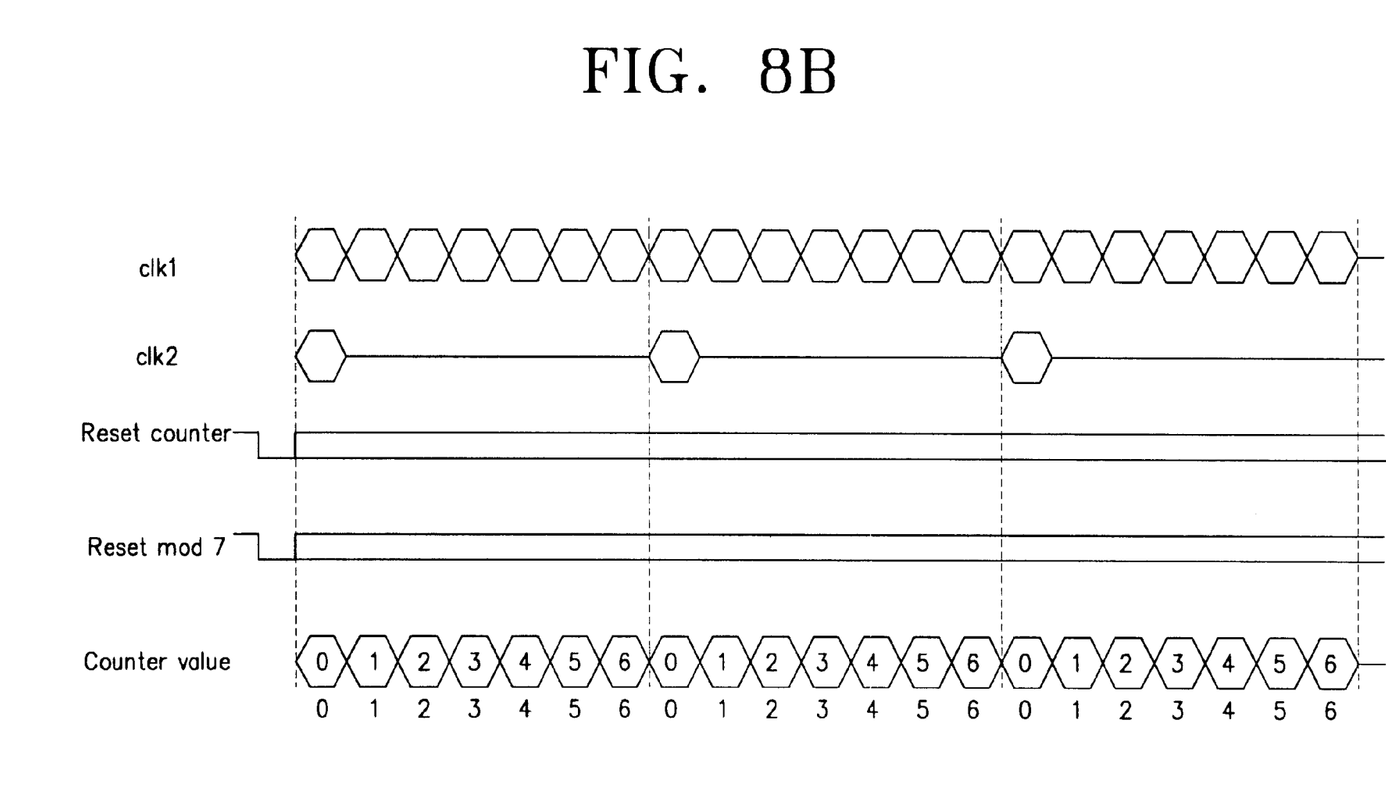
FIG. 8B is a timing diagram of the controller of FIG. 8A.

FIG. 8A shows a detailed block diagram of the controller 721 for controlling group selection according to an embodiment of the present invention, and FIG. 8B shows a timing diagram of the controller 721 of FIG. 8A.

Referring to FIG. 8A, an operator 803 provides a mod 7 operation value to a counter 801 as a start count value in response to a second clock signal clk2 (as shown in FIG. 8B). The counter 801 then begins counting with a start count value provided from the operator 803 in response to a first clock clk1, and uses, as an address for a lookup table, the count value in a lookup table 805 in a group selection order. Here, the counter 801 counts [0 . . . 6] using cyclic shifting.

Figure 9A:
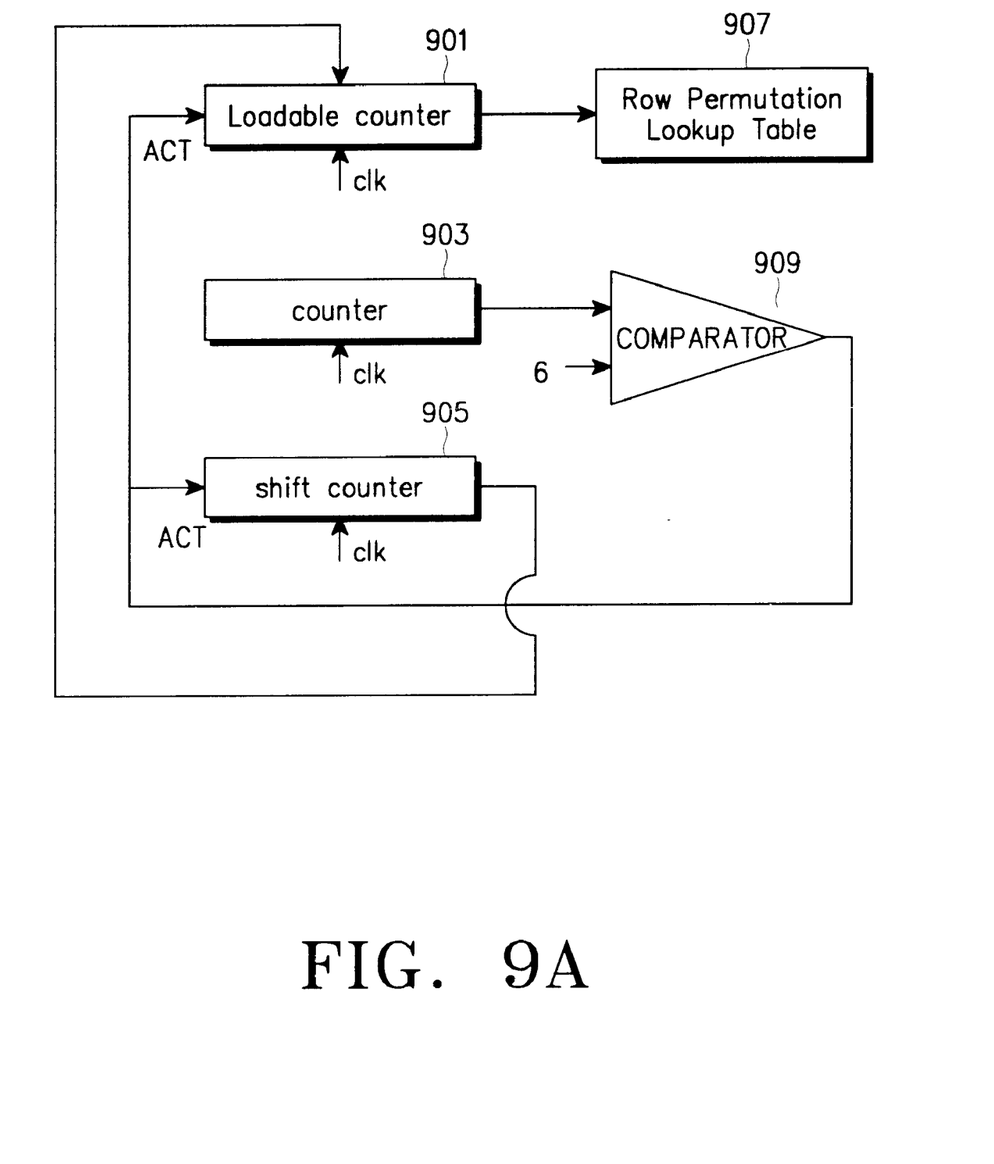
FIG. 9A is a detailed block diagram illustrating the controller of FIG. 7 according to another embodiment of the present invention.
Figure 9B:
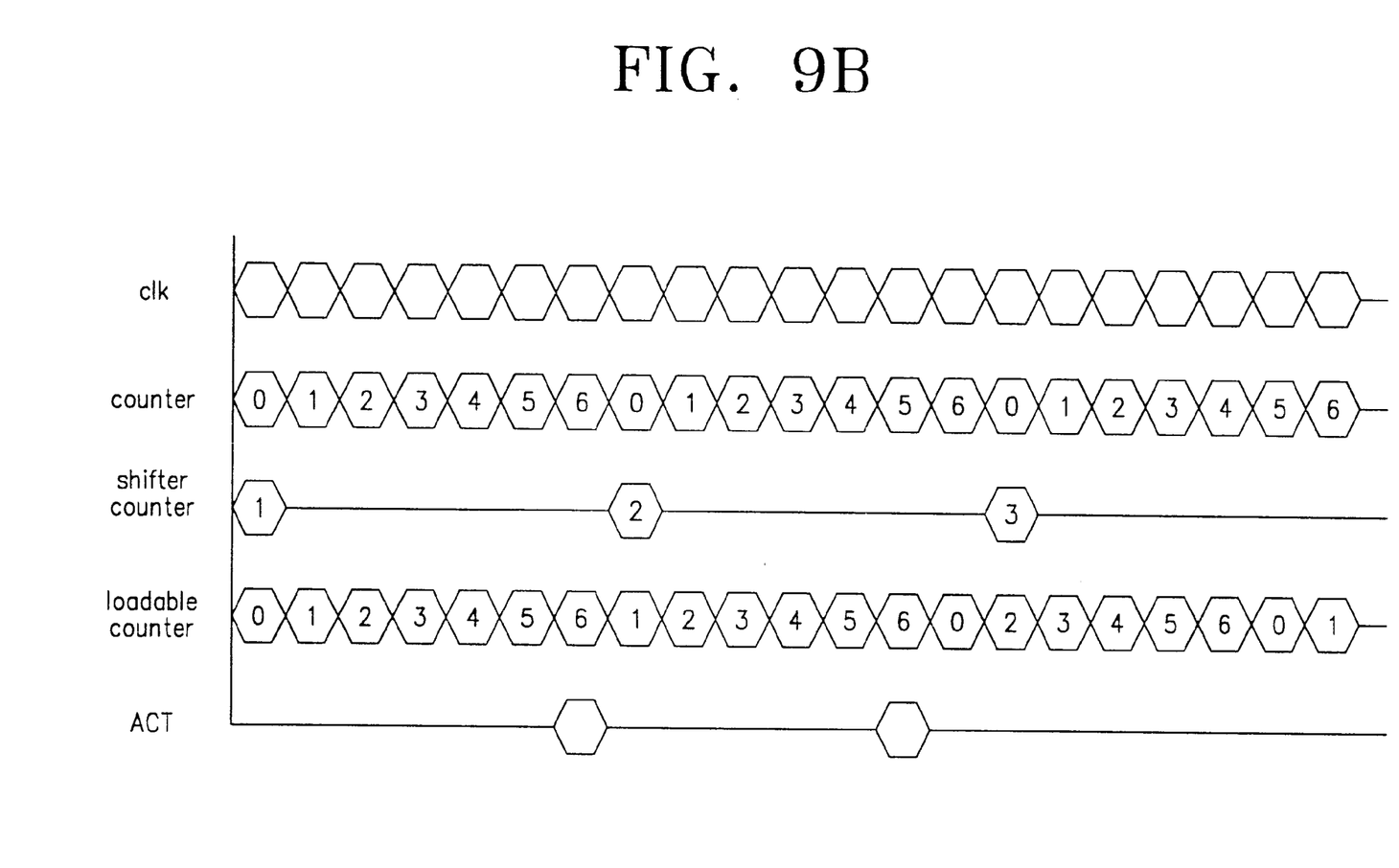
FIG. 9B is a timing diagram of the controller of FIG. 9A.

FIG. 9A shows a detailed block diagram of the controller 721 for controlling group selection according to another embodiment of the present invention, and FIG. 9B shows a timing diagram of the controller 721 of FIG. 9A.

Referring to FIG. 9A, a counter 903 outputs a counter signal of FIG. 9B in response to a clock signal clk of FIG. 9B. A comparator 909 compares a counter signal from the counter 903 with a predetermined number '6', and provides an activation pulse ACT to a loadable counter 901 and a shift counter 905 when the counter signal is identical to the predetermined number '6'. Upon receipt of the activation pulse ACT, the shift counter 905 outputs a shift counter signal (as shown in FIG. 9B) to the loadable counter 901. The loadable counter 901 then writes a loadable counter value (as shown in FIG. 9B), which is shifted by 1 at every period, to the lookup table 907 in the group selection order in response to the clock signal clk.

As described above, the present invention provides a method for satisfying the distance property of the interleaver when performing the 2-dimensional interleaving. That is, the novel 2-dimensional interleaver is designed such that a period of selecting a specific group differs from a period of the turbo encoder, to thereby prevent the component encoder included in the turbo encoder from being reset in the zero state, thereby maximizing the minimum distance of the turbo encoder.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. An encoding device including a first feedback convolutional encoder for encoding n data streams using a primitive polynomial of m'th order, a 2-dimensional interleaver for segmenting the n data streams into k data groups and reading the n data streams from the k data groups and interleaving the n data streams, and a second feedback convolutional encoder for encoding the interleaved data streams from the 2-dimensional interleaver using the primitive polynomial of m'th order, the encoding device comprising:

a controller for controlling selection of the data groups such that an output of the 2-dimensional interleaver differs from a specific pattern when k is a positive multiple of $2^m-1$ and at least one of the data groups has said specific pattern.

2. The encoding device as claimed in claim 1, wherein the controller shifts a data group selection order by a specific value at each selection cycle.

3. The encoding device as claimed in claim 1, wherein said specific pattern is a sequence in which a distance between a first '1' and a subsequent '1' is a multiple of $2^m-1$ bits.

4. An interleaving method in a communication system including a feedback encoder having m memories and a 2-dimensional interleaver having g data groups, where g is a multiple of $2^m-1$, each data group having addresses of a given size, wherein the addresses are selected such that a data group selection cycle for selecting one of the addresses in each data group not equal to a multiple of $2^m-1$.

5. The interleaving method as claimed in claim 4, wherein a data group selection order is shifted by a specific value at each selection cycle.

6. An encoding device including a first feedback convolutional encoder for encoding n data streams using a primitive polynomial of m'th order, a 2-dimensional interleaver for segmenting the n data streams into k data groups and reading the n data streams from the k data groups and interleaving the n data streams, and a second feedback convolutional encoder for encoding the interleaved data streams from the 2-dimensional interleaver using the primitive polynomial of m'th order, the encoding device comprising:

a controller for selecting, when k is a positive multiple of $2^m-1$, a specified one of the k data groups and controlling selection of the data groups such that a cycle of selecting said specified data group differs from a period of the feedback convolutional encoders.

7. The encoding device as claimed in claim 6, wherein the controller shifts a data group selection order by a specific value at each selection cycle.

8. The encoding device as claimed in claim 6, wherein m=3 and the period of the feedback convolutional encoders is 7.

9. An encoding device including a first feedback convolutional encoder for encoding n data streams using a primitive polynomial of m'th order, a 2-dimensional interleaver for segmenting the n data streams into k data groups and reading the n data streams from the k data groups and interleaving the n data streams, and a second feedback convolutional encoder for encoding the interleaved data streams from the 2-dimensional interleaver using the primitive polynomial of m'th order, the encoding device comprising:

a controller for selecting, when k is a positive multiple of $2^m-1$, a specified one of the k data groups and controlling selection of the data groups such that a cycle of selecting said specified data group is not equal to a multiple of $2^m-1$.

10. The encoding device as claimed in claim 9, wherein the controller controls selection of the groups by shifting a data group selection order by a specific value at selection cycle.

11. The encoding device as claimed in claim 10, wherein the data group selection order is a sequence which is randomized according to a specific pattern.

12. The encoding device as claimed in claim 9, wherein the interleaver comprises:

a memory for sequentially storing the n data streams;

an address generator for generating read addresses for each one of the k data groups according to a given interleaving rule; and a selector for selecting the data groups according to a predetermined order under a control of the controller and selecting a read address from the selected data group;

wherein the memory outputs n data streams using the read address from the selector.

13. An interleaving method for an interleaver in an encoding device, said encoding device including a first feedback convolutional encoder for encoding n data streams using a primitive polynomial of m'th order, a 2-dimensional interleaver for segmenting the n data streams into k data groups and reading the n data streams from the k data groups and interleaving the n data streams, and a second feedback convolutional encoder for encoding the interleaved data streams from the 2-dimensional interleaver using the primitive polynomial of m'th order, wherein when k is a positive multiple of $2^m-1$, a specified one of the k data groups is selected and, selection of the data groups is controlled such that a cycle of selecting said specified group is not equal to a multiple of $2^m-1$.

14. The interleaving method as claimed in claim 13, wherein selection of the data groups is controlled by shifting a data group selection order by a specific value at selection cycle.

15. The interleaving method as claimed in claim 14, wherein the data group selection order is a sequence which is randomized according to a specific pattern.

16. An interleaving method for an interleaver in an encoding device, to said encoding device including a first feedback convolutional encoder for encoding n data streams using a primitive polynomial of m'th order, a 2-dimensional interleaver for segmenting the n data streams into k data groups and reading the n data streams from the k data groups and interleaving the n data streams, and a second feedback convolutional encoder for encoding the interleaved data streams from the 2-dimensional interleaver using the primitive polynomial of m'th order, the interleaving method comprising the steps of:

sequentially storing the input n data streams in a memory;

generating a read address according to a given interleaving rule wherein the interleaving rule includes, selecting, when k is a positive multiple of $2^m-1$, a specified one of the k data groups and controlling selection of the data groups such that a period of selecting said specified data group is not equal to a multiple of $2^m-1$; and reading the input data from the memory using the read address.

17. The interleaving method as claimed in claim 16, wherein selection of the groups is controlled by shifting a data group selection order by a specific value at every period.

18. The interleaving method as claimed in claim 17, wherein the data group selection order is a sequence which is randomized according to a specific pattern.

* * * * *